(12) United States Patent
Inazu et al.

(10) Patent No.: US 11,387,386 B2
(45) Date of Patent: Jul. 12, 2022

(54) SEMICONDUCTOR LIGHT EMITTING ELEMENT AND METHOD OF MANUFACTURING SEMICONDUCTOR LIGHT EMITTING ELEMENT

(71) Applicant: NIKKISO CO., LTD., Tokyo (JP)

(72) Inventors: Tetsuhiko Inazu, Hakusan (JP); Noritaka Niwa, Hakusan (JP)

(73) Assignee: NIKKISO CO., LTD., Tokyo (JP)

( * ) Notice: Subject to any disclaimer, the term of this patent is extended or adjusted under 35 U.S.C. 154(b) by 193 days.

(21) Appl. No.: 16/736,179

(22) Filed: Jan. 7, 2020

(65) Prior Publication Data
US 2020/0220046 A1    Jul. 9, 2020

(30) Foreign Application Priority Data

Jan. 7, 2019 (JP) .............................. JP2019-000758
Aug. 21, 2019 (JP) .............................. JP2019-151150

(51) Int. Cl.
*H01L 33/38* (2010.01)
*H01L 33/32* (2010.01)
*H01L 33/48* (2010.01)
*H01L 33/44* (2010.01)

(52) U.S. Cl.
CPC .............. *H01L 33/38* (2013.01); *H01L 33/32* (2013.01); *H01L 33/44* (2013.01); *H01L 33/486* (2013.01); *H01L 2933/0025* (2013.01)

(58) Field of Classification Search
CPC ........ H01L 33/38; H01L 33/32; H01L 33/486; H01L 33/44; H01L 2933/0025; H01L 33/40; H01L 33/62
See application file for complete search history.

(56) References Cited

U.S. PATENT DOCUMENTS

| | | | | |
|---|---|---|---|---|
| 2011/0297965 | A1* | 12/2011 | Akimoto | H01L 33/40 257/79 |
| 2016/0284941 | A1* | 9/2016 | Seo | H01L 33/405 |
| 2017/0373226 | A1* | 12/2017 | Chen | H01L 33/382 |
| 2020/0194628 | A1* | 6/2020 | Seo | H01L 33/46 |

FOREIGN PATENT DOCUMENTS

JP   5985782 B1   9/2016

* cited by examiner

*Primary Examiner* — Su C Kim
(74) *Attorney, Agent, or Firm* — Muncy, Geissler, Olds & Lowe, P.C.

(57) ABSTRACT

A semiconductor light emitting element includes: an n-type semiconductor layer; an active layer provided in a first region on the n-type semiconductor layer; a p-type semiconductor layer provided on the active layer; a first covering layer that is provided to cover a second region on the n-type semiconductor layer different from the first region, a side of the active layer, and the p-type semiconductor layer and that is made of aluminum oxide ($Al_2O_3$); an n-side contact electrode that extends through the first covering layer and is in contact with the n-type semiconductor layer; a p-side contact electrode that extends through the first covering layer and is in contact with the p-type semiconductor layer; and a second covering layer provided to cover the first covering layer, the n-side contact electrode, and the p-side contact electrode.

10 Claims, 10 Drawing Sheets

SEMICONDUCTOR LIGHT EMITTING ELEMENT AND METHOD OF MANUFACTURING SEMICONDUCTOR LIGHT EMITTING ELEMENT

RELATED APPLICATION

Priority is claimed to Japanese Patent Application No. 2019-000758, filed on Jan. 7, 2019, and Japanese Patent Application No. 2019-15110, filed on Aug. 21, 2019, the entire content of which are incorporated herein by reference.

BACKGROUND OF THE INVENTION

1. Field of the Invention

The present invention relates to a semiconductor light emitting element and a method of manufacturing a semiconductor light emitting element.

2. Description of the Related Art

A light emitting element for emitting deep ultraviolet light includes an aluminum gallium nitride (AlGaN)-based n-type clad layer, an active layer, and a p-type clad layer stacked successively on a substrate. An n-side electrode is formed on a partial region of the n-type clad layer exposed by etching, and a p-side electrode is formed on the p-type clad layer. A protective insulation film of silicon oxide ($SiO_2$), aluminum oxide ($Al_2O_3$), or the like is provided on the n-side electrode and the p-side electrode.

It is preferred to cover the surface of the light emitting element more suitably.

SUMMARY OF THE INVENTION

The present invention addresses the above-described issue, and an illustrative purpose thereof is to improve the reliability of a semiconductor light emitting element.

A semiconductor light emitting element according to an embodiment of the present invention includes: an n-type semiconductor layer of an n-type aluminum gallium nitride (AlGaN)-based semiconductor material provided on a substrate; an active layer of an AlGaN-based semiconductor material provided in a first region on the n-type semiconductor layer; a p-type semiconductor layer of a p-type AlGaN-based semiconductor material provided on the active layer; a first covering layer that is provided to cover a second region on the n-type semiconductor layer different from the first region, a side of the active layer, and the p-type semiconductor layer and that is made of aluminum oxide ($Al_2O_3$); an n-side contact electrode that extends through the first covering layer and is in contact with the n-type semiconductor layer; a p-side contact electrode that extends through the first covering layer and is in contact with the p-type semiconductor layer; a second covering layer provided to cover the first covering layer, the n-side contact electrode, and the p-side contact electrode; an n-side pad electrode that extends through the second covering layer and is connected to the n-side contact electrode; and a p-side pad electrode that extends through the second covering layer and is connected to the p-side contact electrode.

According to this embodiment, the n-type semiconductor layer, the active layer, and the p-type semiconductor layer made of an AlGaN-based semiconductor material are covered by aluminum oxide ($Al_2O_3$), which has an excellent moisture resistance, so that the surface of these semiconductor layers is covered suitably. Further, by providing the second covering layer that further covers the first covering layer, the n-type contact electrode and the p-type contact electrode, the first covering layer is protected and, at the same time, the surface of the contact electrodes is covered suitably. In this way, a highly reliable semiconductor light emitting element is provided.

The element may further include: a third covering layer that is provided to cover at least a part of each of a surface of the substrate, the second covering layer, a side of the n-side pad electrode, and a side of the p-side pad electrode and that is made of aluminum oxide ($Al_2O_3$).

The element may further include: a mounting board that includes an n-side mounting electrode connected to the n-side pad electrode and a p-side mounting electrode connected to the p-side pad electrode. The third covering layer may be provided to further cover at least a part of a surface of the mounting board.

A concentration of hydrogen contained in the first covering layer may be lower than a concentration of hydrogen contained in the third covering layer.

The element may further include: a protective insulation layer that is provided between the p-type semiconductor layer and the first covering layer and that is made of silicon oxide ($SiO_2$) or silicon oxynitride (SiON).

The n-type semiconductor layer may have a molar fraction of aluminum nitride (AlN) of 20% or higher, and the active layer may be configured to emit ultraviolet light having a wavelength of 350 nm or shorter.

Another embodiment of the present invention relates to a method of manufacturing a semiconductor light emitting element. The method includes: stacking, on a substrate, an n-type semiconductor layer of an n-type aluminum gallium nitride (AlGaN)-based semiconductor material, an active layer of an AlGaN-based semiconductor material on the n-type semiconductor layer, and a p-type semiconductor layer of a p-type AlGaN-based semiconductor material on the active layer successively; removing a portion of each of the p-type semiconductor layer, the active layer, and the n-type semiconductor layer to expose a portion of the n-type semiconductor layer; forming a first covering layer made of aluminum oxide ($Al_2O_3$) to cover an exposed region of the n-type semiconductor layer, a side of the active layer, and the p-type semiconductor layer; removing the first covering layer in part to form an n-side contact electrode that is in contact with the n-type semiconductor layer; removing the first covering layer in part to form a p-side contact electrode that is in contact with the p-type semiconductor layer; forming a second covering layer that covers the first covering layer, the n-side contact electrode, and the p-side contact electrode; removing the second covering layer in part to form an n-side pad electrode that is connected to the n-side contact electrode; and removing the second covering layer in part to form a p-side pad electrode that is connected to the p-side contact electrode.

According to this embodiment, the n-type semiconductor layer, the active layer, and the p-type semiconductor layer made of an AlGaN-based semiconductor material are covered by aluminum oxide ($Al_2O_3$), which has an excellent moisture resistance, so that the surface of these semiconductor layers is covered suitably. Further, by providing the second covering layer that further covers the first covering layer, the n-type contact electrode, and the p-type contact electrode, the first covering layer is protected and, at the same time, the surface of the contact electrodes is covered suitably. In this way, a highly reliable semiconductor light emitting element is provided.

The first covering layer may be formed by an atomic layer deposition method in which an organic aluminum compound and an oxygen gas ($O_2$) plasma or an ozone gas ($O_3$) are used as source materials.

The method may further include: forming a third covering layer made of aluminum oxide ($Al_2O_3$) to cover a surface of the substrate, the second covering layer, and at least a part of each of a side of the n-side pad electrode and a side of the p-side pad electrode. The third covering layer may be formed by an atomic deposition method in which an organic aluminum compound and water ($H_2O$) are used as source materials.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

DETAILED DESCRIPTION OF THE INVENTION

The invention will now be described by reference to the preferred embodiments. This does not intend to limit the scope of the present invention, but to exemplify the invention.

A detailed description will be given of embodiments to practice the present invention with reference to the drawings. The same numerals are used in the description to denote the same elements and a duplicate description is omitted as appropriate. To facilitate the understanding, the relative dimensions of the constituting elements in the drawings do not necessarily mirror the relative dimensions in the actual light emitting element.

Figure 1:
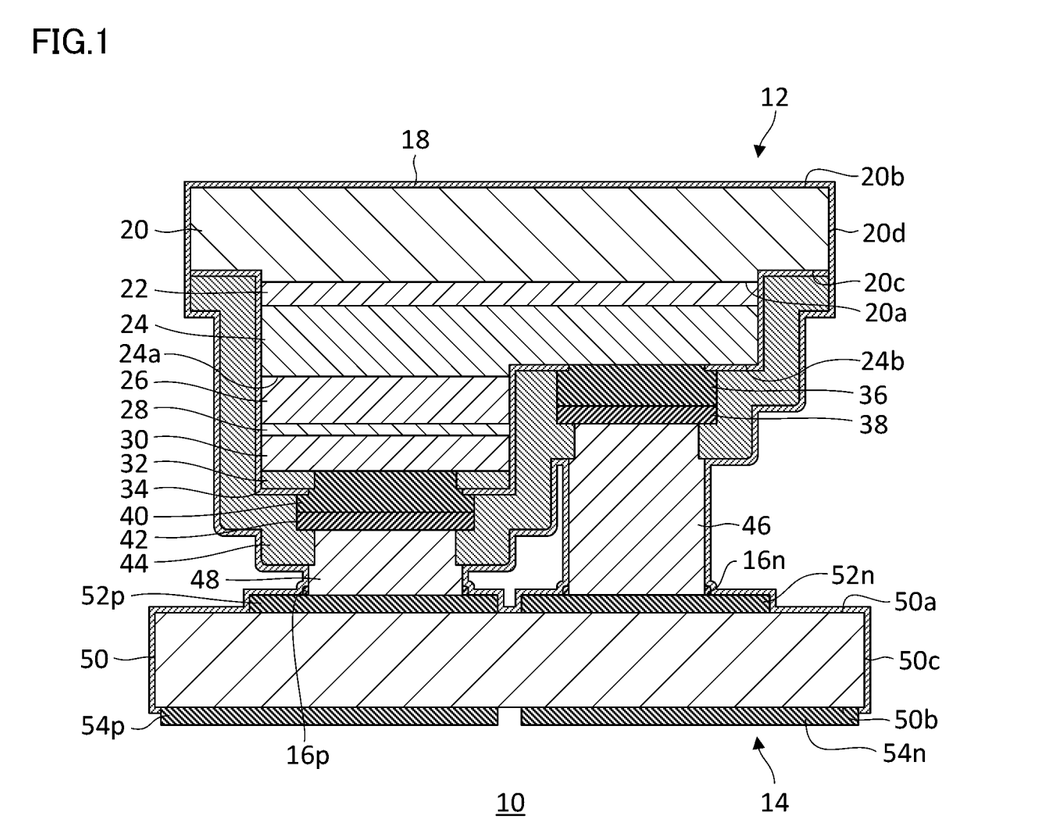
FIG. 1 is a cross-sectional view schematically showing a configuration of a semiconductor light emitting element according to an embodiment.

FIG. 1 is a cross-sectional view schematically showing a configuration of a semiconductor light emitting element 10 according to the embodiment. The semiconductor light emitting element 10 is a light emitting diode (LED) chip configured to emit "deep ultraviolet light" having a central wavelength λ of about 360 nm or shorter. To output deep ultraviolet light having such a wavelength, the semiconductor light emitting element 10 is made of an aluminum gallium nitride (AlGaN)-based semiconductor material having a band gap of about 3.4 eV or larger. The embodiment particularly shows a case of emitting deep ultraviolet light having a central wavelength λ of about 240 nm-350 nm.

In this specification, the term "AlGaN-based semiconductor material" refers to a semiconductor material containing at least aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0<x+y\leq1$, $0<x<1$, $0<y<1$). The AlGaN-based semiconductor material shall encompass aluminum gallium nitride (AlGaN) or indium aluminum gallium nitride (InAlGaN). The "AlGaN-based semiconductor material" in this specification has a molar fraction of AlN and a molar fraction of GaN of 1% or higher, and, preferably, 5% or higher, 10% or higher, or 20% or higher.

Those materials that do not contain AlN may be distinguished by referring to them as "GaN-based semiconductor materials". "GaN-based semiconductor materials" include GaN or InGaN. Similarly, those materials that do not contain GaN may be distinguished by referring to them as "AlN-based semiconductor materials". "AlN-based semiconductor materials" include AlN or InAlN.

The semiconductor light emitting element 10 includes a die 12, a mounting board 14, metal bonding members 16n, 16p, and a covering layer (also referred to as a third covering layer) 18. The die 12 includes a substrate 20, a buffer layer 22, an n-type clad layer 24, an active layer 26, an electron blocking layer 28, a p-type clad layer 30, a protective insulation layer 32, a first covering layer 34, an n-side contact electrode 36, an n-side protective metal layer 38, a p-side contact electrode 40, a p-side protective metal layer 42, a second covering layer 44, an n-side pad electrode 46, and a p-side pad electrode 48.

Referring to FIG. 1, the direction away from the substrate 20 and toward the mounting board 14 may be defined as "upward". This is because, in the manufacturing steps of FIGS. 2-12 described later, the die 12 is turned upside down and mounted on the mounting board 14 after the layers are stacked on the substrate 20.

The substrate 20 is a substrate having translucency for the deep ultraviolet light emitted by the semiconductor light emitting element 10 and is, for example, a sapphire ($Al_2O_3$) substrate. The substrate 20 includes a first principal surface 20a and a second principal surface 20b opposite to the first principal surface 20a. The first principal surface 20a is a principal surface that is a crystal growth surface for growing the buffer layer 22 and the layers above. An outer circumferential surface 20c having a height different from a height of the first principal surface 20a is provided on the outer circumference of the first principal surface 20a. The second principal surface 20b is a principal surface that is a light extraction substrate for extracting the deep ultraviolet light emitted by the active layer 26 outside. In one variation, the substrate 20 may be an aluminum nitride (AlN) substrate or an aluminum gallium nitride (AlGaN) substrate.

The buffer layer 22 is formed on the first principal surface 20a of the substrate 20. The buffer layer 22 is a foundation layer (template layer) to form the n-type clad layer 24 and the layers above. For example, the buffer layer 22 is an undoped AlN layer and is, specifically, an AlN (HT-AlN; High Temperature AlN) layer gown at a high temperature. The buffer layer 22 may include an undoped AlGaN layer formed on the AlN layer. In one variation, the buffer layer 22 may be formed only by an undoped AlGaN layer when the substrate 20 is an AlN substrate or an AlGaN substrate. In other words, the buffer layer 22 includes at least one of an undoped AlN layer and an AlGaN layer.

The n-type clad layer 24 is an n-type semiconductor layer formed on the buffer layer 22. The n-type clad layer 24 is an n-type AlGaN-based semiconductor material layer. For example, the n-type clad layer 24 is an AlGaN layer doped with silicon (Si) as an n-type impurity. The composition ratio of the n-type clad layer 24 is selected to transmit the deep ultraviolet light emitted by the active layer 26. For example, the n-type clad layer 24 is formed such that the molar fraction of AlN is 25% or higher, preferably 40% or higher, or more preferably 50% or higher. The n-type clad layer 24 has a band gap larger than the wavelength of the deep ultraviolet light emitted by the active layer 26. For example, the n-type clad layer 24 is formed to have a band gap of 4.3 eV or larger. It is preferable to form the n-type clad layer 24 such that the molar fraction of AlN is 80% or lower, i.e., the band gap is 5.5 eV or smaller. It is more preferable to form the n-type clad layer 24 such that the molar fraction of AlN is 70% or lower (i.e., the band gap is 5.2 eV or smaller). The n-type clad layer 24 has a thickness of about 1 µm-3 µm. For example, the n-type clad layer 24 has a thickness of about 2 µm.

The n-type clad layer 24 is formed such that the concentration of silicon (Si) as the impurity is not lower than $1 \times 10^{18}/cm^3$ and not higher than $5 \times 10^{19}/cm^3$. It is preferred to form the n-type clad layer 24 such that the Si concentration is not lower than $5 \times 10^{18}/cm^3$ and not higher than $3 \times 10^{19}/cm^3$, more preferably not lower than $7 \times 10^{18}/cm^3$ and not higher than $2 \times 10^{19}/cm^3$. In one example, the Si concentration in the n-type clad layer 24 is around $1 \times 10^{19}/cm^3$ and is in a range not lower than $8 \times 10^{18}/cm^3$ and not higher than $5 \times 10^{19}/cm^3$.

The active layer 26 is made of an AlGaN-based semiconductor material and has a double heterojunction structure by being sandwiched between the n-type clad layer 24 and the electron blocking layer 28. The active layer 26 may have a monolayer or multilayer quantum well structure. For example, the active layer 26 may be formed by stack of a barrier layer made of an undoped AlGaN-based semiconductor material and a well layer made of an undoped AlGaN-based semiconductor material. To output deep ultraviolet light having a wavelength of 355 nm or shorter, the active layer 26 is formed to have a band gap of 3.4 eV or larger. For example, the AlN composition ratio of the active layer 26 is selected so as to output deep ultraviolet light having a wavelength of 310 nm or shorter. The active layer 26 is provided on a first top surface 24a of the n-type clad layer 24 and is not provided on a second top surface 24b adjacent to the first top surface 24a. In other words, the active layer 26 is not formed on the entirety of the n-type clad layer 24 and is formed only in a partial region of the n-type clad layer 24.

The electron blocking layer 28 is formed on the active layer 26. The electron blocking layer 28 is an undoped AlGaN-based semiconductor material layer and is formed such that the molar fraction of AlN is 40% or higher, and, preferably, 50% or higher. The electron blocking layer 28 may be formed such that the molar fraction of AlN is 80% or higher, or may be made of an AlN-based semiconductor material that does not contain GaN. The electron blocking layer has a thickness of about 1 nm-10 nm. For example, the electron blocking layer has a thickness of about 2 nm-5 nm. The electron blocking layer 28 may be a p-type AlGaN-based semiconductor material layer.

The p-type clad layer 30 is a p-type semiconductor layer formed on the electron blocking layer 28. The p-type clad layer 30 is a p-type AlGaN-based semiconductor material layer. For example, the p-type clad layer 30 is an AlGaN layer doped with magnesium (Mg) as a p-type impurity. The p-type clad layer 30 has a thickness of about 300 nm-700 nm. For example, the p-type clad layer 30 has a thickness of about 400 nm-600 nm. The p-type clad layer 30 may be made of a p-type GaN-based semiconductor material that does not contain AlN.

The protective insulation layer 32 is provided on the p-type clad layer 30. The protective insulation layer 32 is made of silicon oxide ($SiO_2$) or silicon oxynitride (SiON). The protective insulation layer 32 is made of a material having a lower refractive index for the deep ultraviolet light output from the active layer 26 than the p-type clad layer 30. The refractive index of the AlGaN-based semiconductor material forming the p-type clad layer 30 is about 2.1-2.56, depending on the composition ratio. Meanwhile, the refractive index of $SiO_2$ forming the protective insulation layer 32 is about 1.4, and the refractive index of SiON is about 1.4-2.1. By providing the protective insulation layer 32 having a low refractive index, more of the ultraviolet light from the active layer 26 is totally reflected at the interface between the p-type clad layer 30 and the protective insulation layer 32 and guided toward the second principal surface 20b of the substrate 20, which is the light extraction surface. In particular, silicon oxide ($SiO_2$) provides a large refractive index difference from the p-type clad layer 30 and so can enhance the reflection characteristic. The thickness of the protective insulation layer 32 is 50 nm or larger. For example, the thickness may be not less than 100 nm and not more than 500 nm.

The first covering layer 34 is provided to cover the top of the protective insulation layer 32, the second top surface 24b of the n-type clad layer 24 and to cover the sides of the n-type clad layer 24, the active layer 26, and the electron blocking layer 28. The first covering layer 34 may cover the side of the buffer layer 22 and the outer circumferential surface 20c of the substrate 20 as shown in the figure. The first covering layer 34 is made of aluminum oxide ($Al_2O_3$). Aluminum oxide ($Al_2O_3$) forming the first covering layer 34 has a more excellent moisture resistance than silicon oxide ($SiO_2$). Thus, covering the entirety of the top and side of each of the semiconductor layers with the first covering layer 34 provides a protective function with excellent moisture resistance. Further, aluminum oxide ($Al_2O_3$) forming the first covering layer 34 has a low absorptance for the deep ultraviolet light output from the active layer 26 and so inhibits reduction in light output caused by providing the first covering layer 34. The thickness of the first covering layer 34 may be not less than 10 nm and not more than 50 nm. For example, the thickness may be about 10 nm-30 nm.

$Al_2O_3$ forming the first covering layer 34 preferably has a tight structure having a high film density. For example, it is preferred to form the first covering layer 34 by using the atomic layer deposition (ALD) method. Further, it is preferred that the first covering layer 34 has a low hydrogen concentration. If the first covering layer 34 contains hydrogen (H) in high concentration, hydrogen spreads to the active layer 26 and the p-type clad layer 30, which may cause degradation in these semiconductor layers. To ensure that $Al_2O_3$ has a low hydrogen concentration, it is preferred to use an oxygen gas ($O_2$) plasma or an ozone gas ($O_3$) instead of water ($H_2O$) as a source of supplying oxygen atoms. In other words, it is preferred to form the first covering layer 34 by the ALD method in which an organic aluminum compound such as trimethylaluminium (TMA) and an $O_2$ plasma or $O_3$ are used as source materials.

The n-side contact electrode 36 is provided on the second top surface 24b of the n-type clad layer 24 and is contact with the n-type clad layer 24 via an opening that extends through the first covering layer 34 on the second top surface 24b of the n-type clad layer 24. For example, the n-side contact electrode 36 includes a Ti layer in contact with the n-type clad layer 24 and an Al layer in contact with the Ti layer. The thickness of the Ti layer is about 1 nm-10 nm and is preferably 5 nm or smaller, more preferably 2 nm or smaller. By configuring the Ti layer to have a small thickness, the ultraviolet reflectivity of the n-side contact electrode 36 as viewed from the n-type clad layer 24 is increased. The thickness of the Al layer is about 100 nm-1000 nm and is preferably 200 nm or smaller, more preferably 300 nm or smaller. By configuring the Al layer to have a large thickness, the ultraviolet reflectivity of the n-side contact electrode 36 is increased. It is preferred that the n-side contact electrode 36 does not contain gold (Au), which could cause reduction in the ultraviolet reflectivity.

The p-side contact electrode 40 is provided on the p-type clad layer 30 and is contact with the p-type clad layer 30 via an opening that extends through the protective insulation layer 32 on the p-type clad layer 30 and through the first covering layer 34. The p-side contact electrode 40 is made of a transparent conductive oxide (TCO) such as tin oxide ($SnO_2$), zinc oxide (ZnO), and indium tin oxide (ITO). The thickness of the p-side contact electrode 40 is about 20 nm-500 nm and is preferably 50 nm or larger, more preferably 100 nm or larger.

The n-side protective metal layer 38 is provided on the n-side contact electrode 36, and the p-side protective metal layer 42 is provided on the p-side contact electrode 40. The n-side protective metal layer 38 and the p-side protective metal layer 42 (generically referred to as protective metal layers) are made of a metal material that can be adhesively in contact with the second covering layer 44 and are comprised of a single metal film or metal stack film. It is preferred to form the protective metal layers 38, 42 by a metal material having a high resistance to an etching gas to make them function as a stop layer in the dry-etching step for forming the opening that extends through the second covering layer 44. For example, platinum group metals can be used as a material of the protective metal layers 38, 42, and palladium (Pd) can be used. The thickness of the protective metal layers 38, 42 is preferably 50 nm or larger, and, more preferably, 100 nm or larger.

The second covering layer 44 is provided to cover the first covering layer 34, the n-side contact electrode 36, the n-side protective metal layer 38, the p-side contact electrode 40, and the p-side protective metal layer 42. The second covering layer 44 is made of an oxide, a nitride, or an oxynitride that is insulative. For example, silicon oxide ($SiO_2$), silicon nitride (SiN), aluminum nitride (AlN), silicon oxynitride (SiON), or aluminum oxynitride (AlON) can be used. The thickness of the second covering layer 44 is 50 nm or larger and is preferably 100 nm or larger. The thickness of the second covering layer 44 may be about 500 nm-1000 nm. By configuring the second covering layer 44 to have a large thickness, the contact electrodes 36, 40 and the protective metal layers 38, 42, which have a larger thickness than the semiconductor layers, are suitably covered.

The n-side pad electrode 46 and the p-side pad electrode 48 (generically referred to as pad electrodes) are bonded portions when the die 12 is mounted on the mounting board 14. The n-side pad electrode 46 is provided on the n-side protective metal layer 38 and is contact with the n-side protective metal layer 38 via the opening that extends through the second covering layer 44. The n-side pad electrode 46 is electrically connected to the n-side contact electrode 36 via the n-side protective metal layer 38. The p-side pad electrode 48 is provided on the p-side protective metal layer 42 and is contact with the p-side protective metal layer 42 via the opening that extends through the second covering layer 44. The p-side pad electrode 48 is electrically connected to the p-side contact electrode 40 via the p-side protective metal layer 42.

From the perspective of providing resistance to corrosion, the pad electrodes 46, 48 are configured to contain gold (Au). For example, the pad electrodes 46, 48 are formed by, for example, a nickel (Ni)/Au, titanium (Ti)/Au, or Ti/platinum (Pt)/Au stack structure. In the case the pad electrodes 46, 48 are bonded by gold-tin (AuSn), the AuSn layer embodying the metal bonding member may be included in the pad electrodes 46, 48.

The die 12 is mounted on the mounting board 14. The mounting board 14 includes a base part 50, mounting electrodes 52n, 52p, external terminals 54n, 54p. The base part 50 is a plate-shaped member made of a ceramic material such as aluminum nitride (AlN). The mounting electrodes 52n, 52p are provided on a first principal surface 50a of the base part 50. The mounting electrodes 52n, 52p are metal electrodes bonded to the pad electrodes 46, 48 of the die 12 and are configured to include gold (Au) from the perspective of providing resistance to corrosion. The external terminals 54n, 54p are metal terminals for soldering the semiconductor light emitting element 10 to a printed board or the like and are provided on the second principal surface 50b opposite to the first principal surface 50a of the base part 50. Inside the base part 50, the n-side mounting electrode 52n and the n-side external terminal 54n are electrically connected, and the p-side mounting electrode 52p and the p-side external terminal 54p are electrically connected.

The metal bonding members 16n, 16p bond the die 12 and the mounting board 14. The metal bonding members 16n, 16p are made of a gold-tin (AuSn) or tin-zinc (SnZn)-based solder material. The p-side metal bonding member 16n bonds the n-side pad electrode 46 and the n-side mounting electrode 52n, and p-side metal bonding member 16p bonds the p-side pad electrode 48 and the p-side mounting electrode 52p.

The third covering layer 18 is provided to cover the entirety of the die 12, a portion of the surface of the mounting board 14, and the metal bonding members 16n, 16p. The third covering layer 18 covers the second principal surface 20b and a side surface 20d of the substrate 20, the surface of the second covering layer 44, and the sides of the n-side pad electrode 46 and the p-side pad electrode 48. Further, the third covering layer 18 covers the first principal surface 50a and a side surface 50c of the mounting board 14 and the surfaces of the mounting electrodes 52n, 52p.

The third covering layer 18 is made of aluminum oxide ($Al_2O_3$). The third covering layer 18 is preferably formed by the atomic layer deposition (ALD) method to produce a tight structure having a high film density, as similar to the first covering layer 34 described above. Meanwhile, since the third covering layer 18 is not directly in contact with the semiconductor layer such as the active layer 26 of the die 12, the hydrogen concentration need not necessarily be low. In other words, the hydrogen concentration of the third covering layer 18 may be higher than the hydrogen concentration of the first covering layer 34. Therefore, water ($H_2O$) may be used as a source of supplying oxygen atoms of $Al_2O_3$ forming the third covering layer 18. The third covering layer 18 may be formed by the ALD method in which an organic aluminum compound such as TMA and $H_2O$ are used as source materials. By using $H_2O$ as a source material, it is easy to allow the source materials to reach small gaps more successfully than by using an $O_2$ plasma or $O_3$. A tight $Al_2O_3$ layer is suitably formed even in small gaps between the die 12 and the mounting board 14. The thickness of the third covering layer 18 may be not less than 10 nm and not more than 50 nm. For example, the thickness may be about 10 nm-30 nm.

Figure 2:
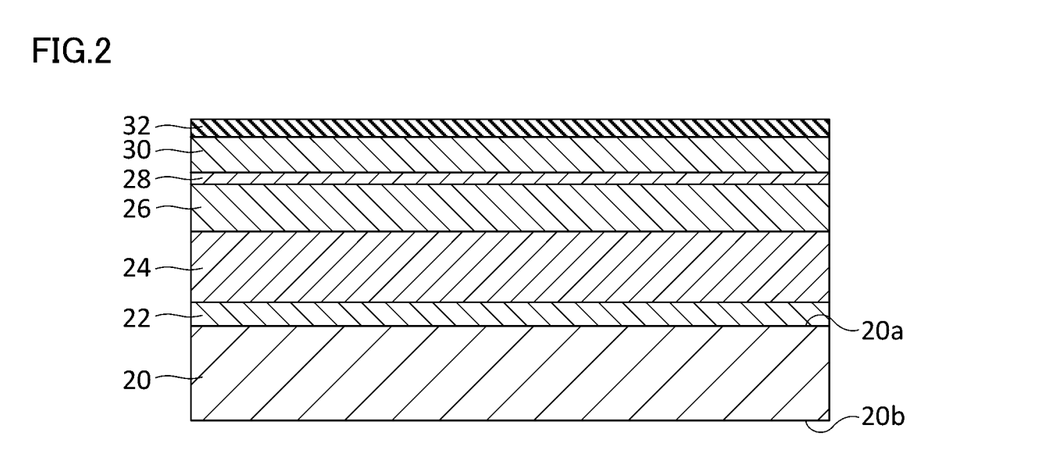
FIG. 2 schematically shows a step of manufacturing the semiconductor light emitting element.

A description will now be given of a method of manufacturing the semiconductor light emitting element 10. FIGS. 2-13 schematically show steps of manufacturing the semiconductor light emitting element 10. First, as shown in FIG. 2, the buffer layer 22, the n-type clad layer 24, the active layer 26, the electron blocking layer 28, the p-type clad layer 30, and the protective insulation layer 32 are formed on the first principal surface 20a of the substrate 20 successively.

The substrate 20 is a sapphire ($Al_2O_3$) substrate. For example, the buffer layer 22 is formed on the (0001) plane of the sapphire substrate. The buffer layer 22 includes, for example, an AlN (HT-AlN) layer grown at a high temperature and an undoped AlGaN (u-AlGaN) layer. The n-type clad layer 24, the active layer 26, the electron blocking layer 28, and the p-type clad layer 30 are layers made of an AlGaN-based semiconductor material, an AlN-based semiconductor material, or a GaN-based semiconductor material and can be formed by a well-known epitaxial growth method such as the metalorganic vapor phase epitaxy (MOVPE) method and the molecular beam epitaxial (MBE) method. The protective insulation layer 32 is made of $SiO_2$ or SiON and can be formed by a well-known technology such as chemical vapor deposition (CVD).

Figure 3:
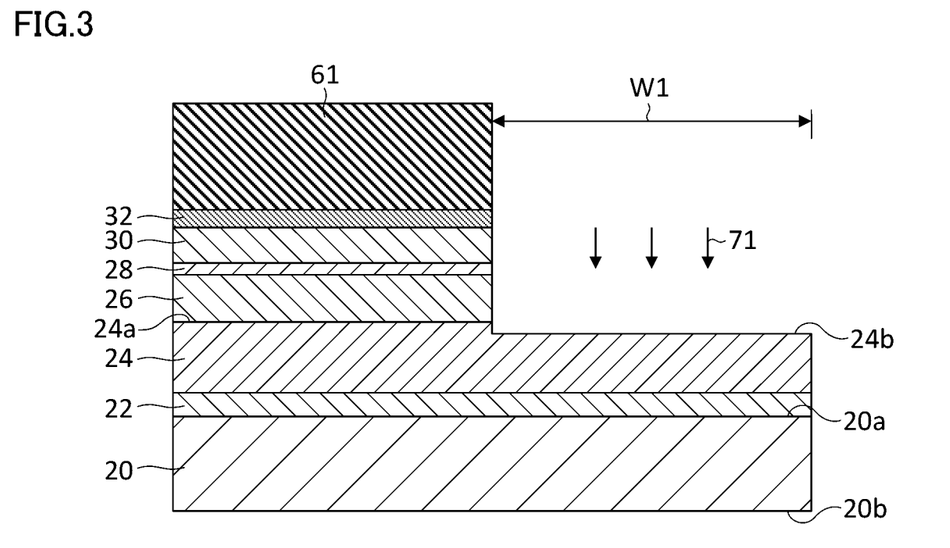
FIG. 3 schematically shows a step of manufacturing the semiconductor light emitting element.

Subsequently, as shown in FIG. 3, a first mask 61 is formed on the protective insulation layer 32. A portion of each of the protective insulation layer 32, the p-type clad layer 30, the electron blocking layer 28, the active layer 26, and the n-type clad layer 24 in a first region W1, in which the first mask 61 is not formed, is removed. This forms the second top surface 24b (exposed surface) of the n-type clad layer 24 in the first region (also referred to as the exposed region) W1. In the step of forming the exposed surface of the n-type clad layer 24, the layers can be removed by dry etching 71. For example, reactive ion etching using an etching gas turned into a plasma can be used. For example, inductively coupled plasma (ICP) etching may be used. The first mask 61 is then removed.

Figure 4:
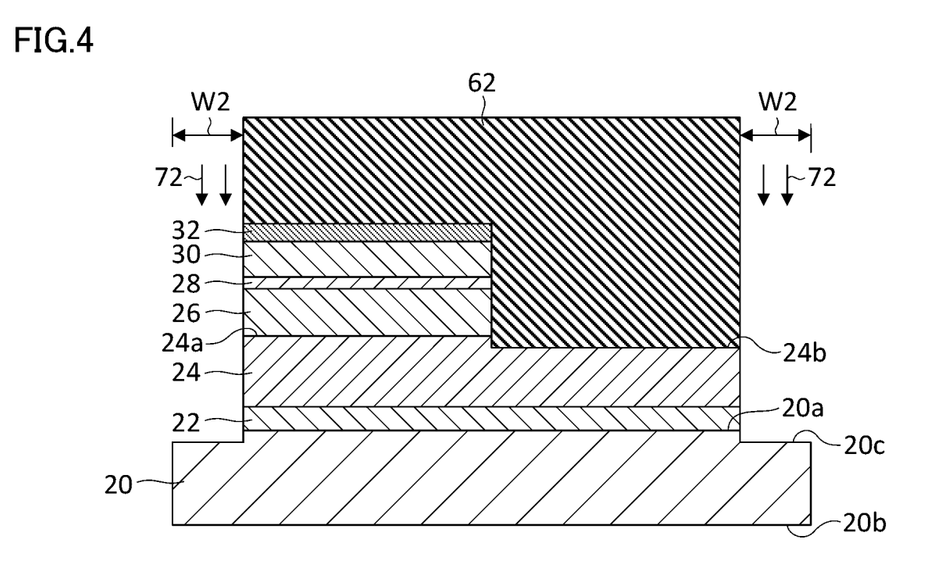
FIG. 4 schematically shows a step of manufacturing the semiconductor light emitting element.

Subsequently, as shown in FIG. 4, a second mask 62 is formed on the protective insulation layer 32 and on the second top surface 24b of the n-type clad layer 24. Subsequently, the protective insulation layer 32, the p-type clad layer 30, the electron blocking layer 28, the active layer 26, and the n-type clad layer 24 in a second region (also referred to as the outer circumferential region) W2, in which the second mask 62 is not formed, are removed by dry-etching 72. The second region W2 is a region for providing isolation between elements in the case that multiple light emitting elements (dies) are formed on one substrate. In the second region W2, the buffer layer 22 may be removed in part, or the buffer layer 22 may be completely removed to expose the substrate 20. In the second region W2, the substrate 20 may be removed in part to expose the outer circumferential surface 20c of the substrate 20 having a height different from a height of the first principal surface 20a. The second mask 62 is then removed.

Figure 5:
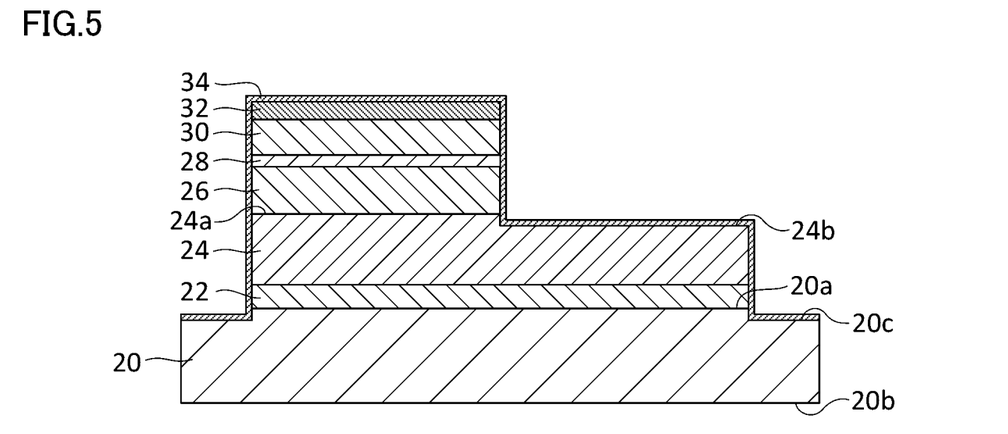
FIG. 5 schematically shows a step of manufacturing the semiconductor light emitting element.

Subsequently, as shown in FIG. 5, the first covering layer 34 is formed to cover the entirety of the top surface of the element structure. The first covering layer 34 is made of $Al_2O_3$ and is formed by, for example, the ALD method in which TMA and an $O_2$ plasma or $O_3$ are used as source materials. The first covering layer 34 is formed to cover the top of the protective insulation layer 32, the second top surface 24b of the n-type clad layer 24 and to cover the sides of the n-type clad layer 24, the active layer 26, the electron blocking layer 28, and the p-type clad layer 30. The protective insulation layer 32 may cover the side of the buffer layer 22 or cover at least a part of the outer circumferential surface 20c or the side surface of the substrate 20.

Figure 6:
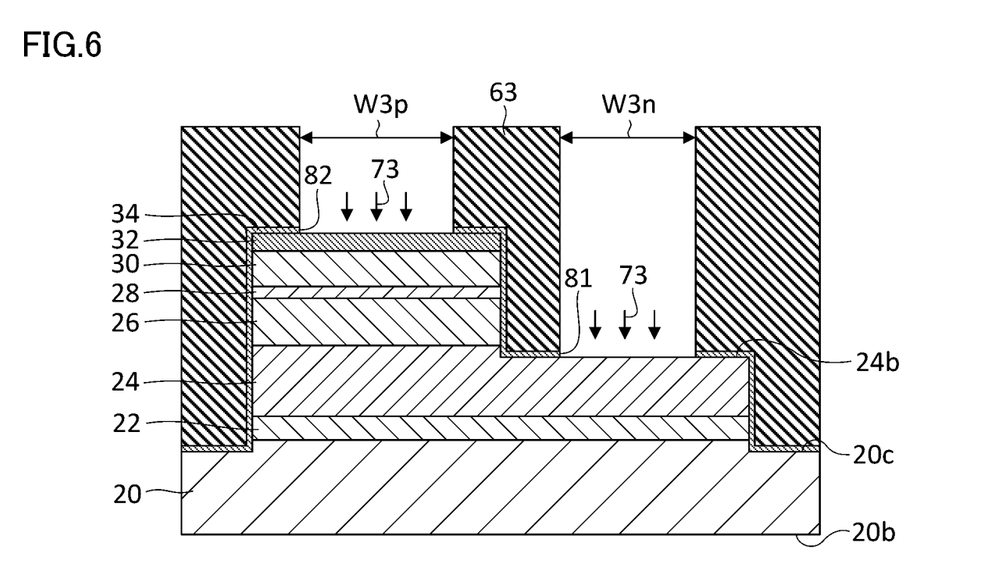
FIG. 6 schematically shows a step of manufacturing the semiconductor light emitting element.

As shown in FIG. 6, a third mask 63 is then formed on the first covering layer 34. The third mask 63 is formed to exclude an n-side electrode region W3n on the second top surface 24b of the n-type clad layer 24 and a p-side electrode region W3p on the p-type clad layer 30. Subsequently, the first covering layer 34 is removed by dry-etching 73 in the n-side electrode region W3n and the p-side electrode region W3p. This forms a first opening 81 in the n-side electrode region W3n in which the n-type clad layer 24 is exposed and forms a second opening 82 in the p-side electrode region W3p in which the protective insulation layer 32 is exposed. The third mask 63 is then removed.

Figure 7:
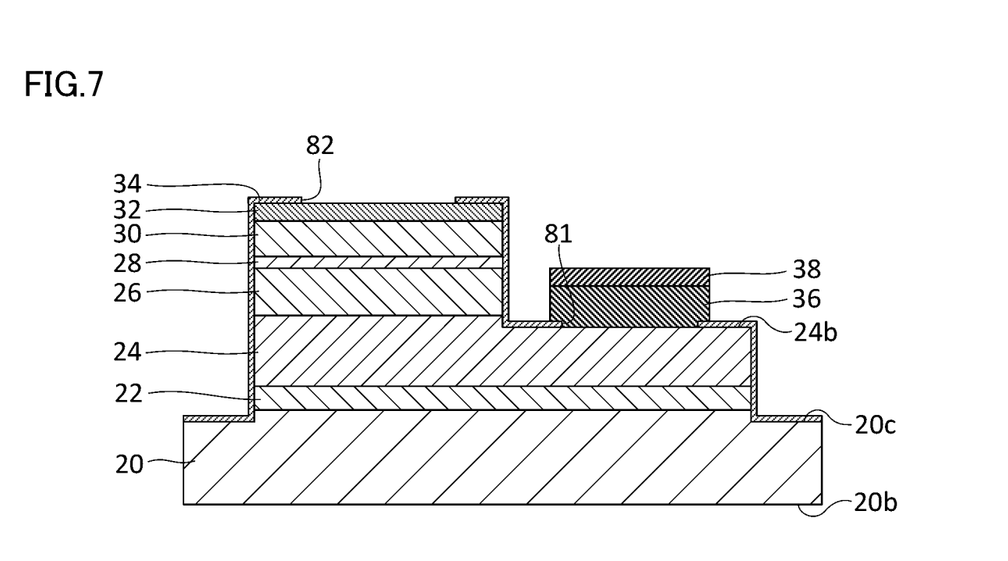
FIG. 7 schematically shows a step of manufacturing the semiconductor light emitting element.

Subsequently, as shown in FIG. 7, the n-side contact electrode 36 is formed on the n-type clad layer 24 exposed in the first opening 81, and the n-side protective metal layer 38 is formed on the n-side contact electrode 36. The n-side contact electrode 36 is, for example, a stack structure of a Ti layer and and an Al layer, and the n-side protective metal layer 38 is, for example, a Pd layer. The n-side contact electrode 36 and the n-side protective metal layer 38 can be formed by sputtering or electron beam (EB) deposition.

Figure 8:
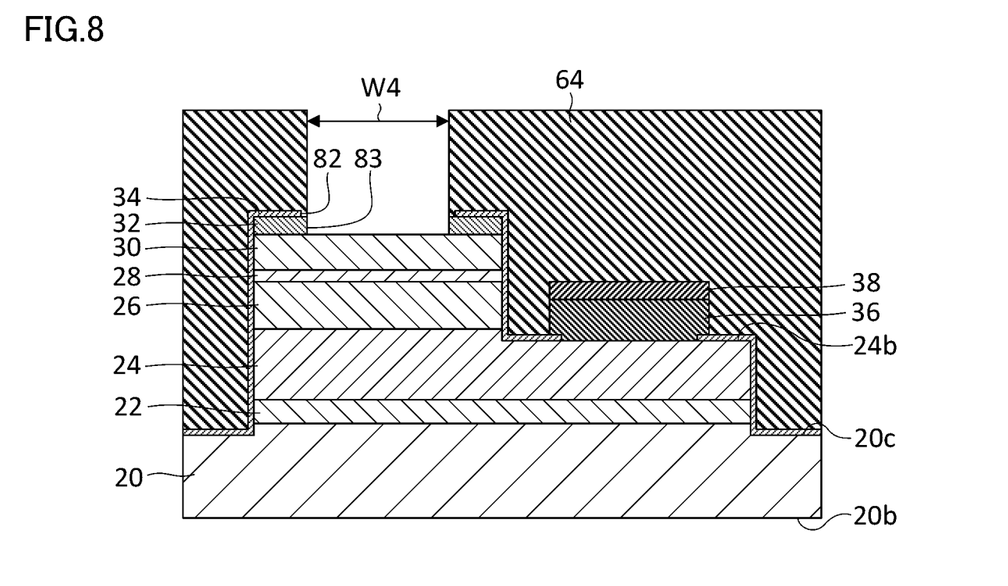
FIG. 8 schematically shows a step of manufacturing the semiconductor light emitting element.

Subsequently, as shown in FIG. 8, a fourth mask 64 is formed to exclude a fourth region W4 corresponding to the second opening 82. This is followed by removal of the protective insulation layer 32 by wet-etching in the fourth region to form a third opening 83 in which the p-type clad layer 30 is exposed. The protective insulation layer 32 can be removed by using, for example, buffered hydrofluoric acid (BHF) that is a liquid containing a mixture of hydrofluoric acid (HF) and ammonium fluoride ($NH_4F$). Wet-etching of the protective insulation layer 32 reduces a damage impact on the p-type clad layer 30 exposed in the third opening 83 as contrasted with the case of dry-etching the protective insulation layer 32. The fourth mask 64 is then removed.

Figure 9:
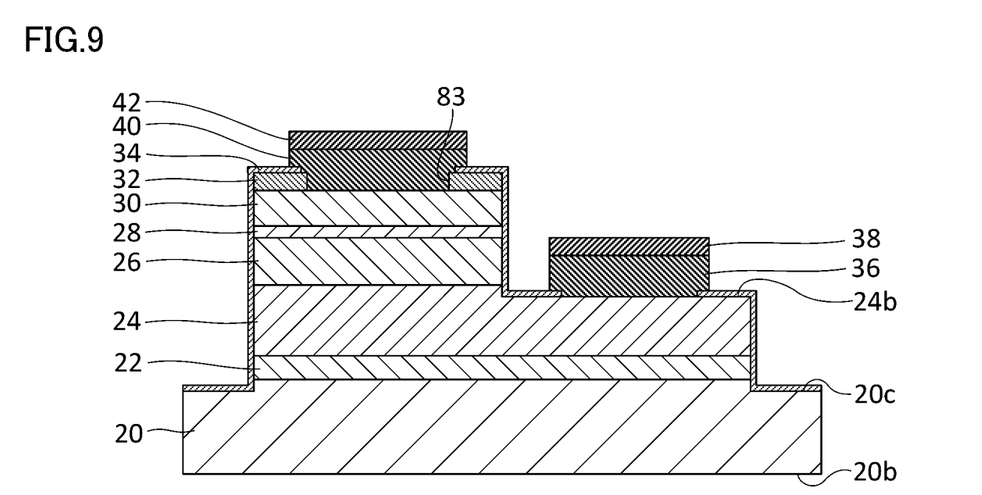
FIG. 9 schematically shows a step of manufacturing the semiconductor light emitting element.

Subsequently, as shown in FIG. 9, the p-side contact electrode 40 is formed on the p-type clad layer 30 exposed in the third opening 83, and the p-side protective metal layer 42 is formed on the p-side contact electrode 40. The p-side contact electrode 40 is, for example, an ITO layer, and the p-side protective metal layer 42 is, for example, a Pd layer. The p-side contact electrode 40 and the p-side protective metal layer 42 can be formed by sputtering or electron beam (EB) deposition.

Figure 10:
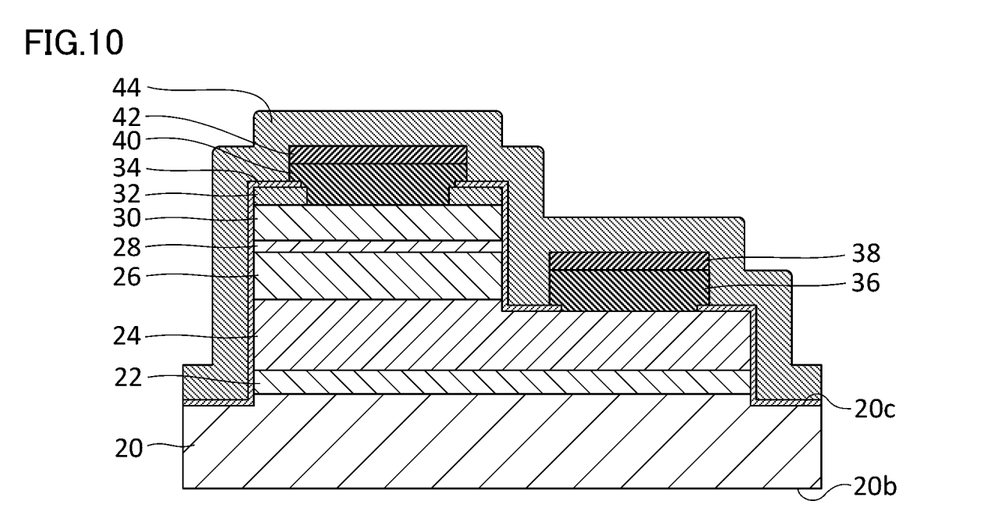
FIG. 10 schematically shows a step of manufacturing the semiconductor light emitting element.

Subsequently, as shown in FIG. 10, the second covering layer 44 is formed to cover the entirety of the top surface of the element structure. The second covering layer 44 is provided to cover the first covering layer 34 and to cover the n-side contact electrode 36, the n-side protective metal layer 38, the p-side contact electrode 40, and the p-side protective metal layer 42. The second covering layer 44 is, for example, an $SiO_2$ layer and can be formed by a well-known technology such as chemical vapor deposition (CVD).

Figure 11:
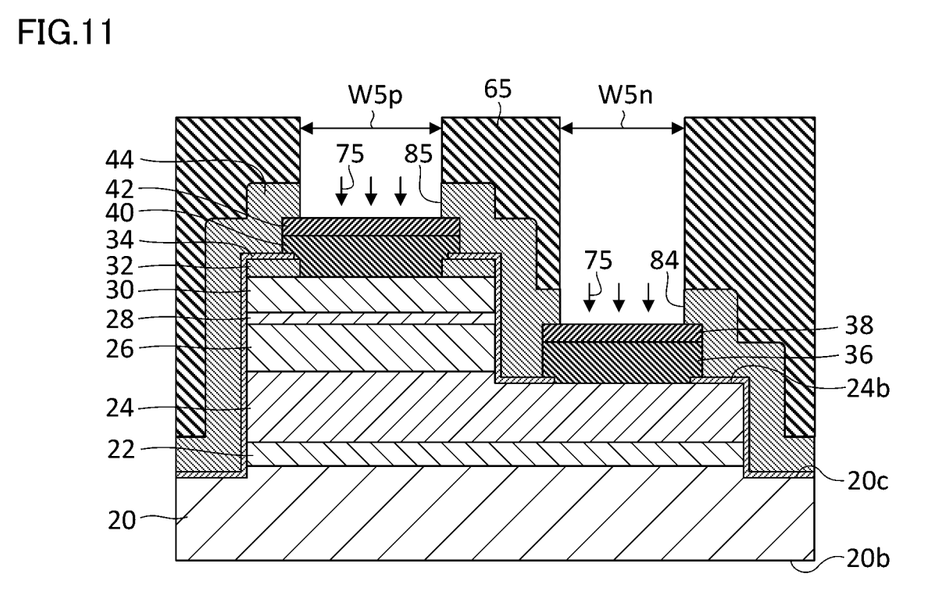
FIG. 11 schematically shows a step of manufacturing the semiconductor light emitting element.

Subsequently, as shown in FIG. 11, a fifth mask 65 is formed on the second covering layer 44. The fifth mask 65 is formed to exclude an n-side electrode region W5n corresponding to the n-side contact electrode 36 and a p-side electrode region W5p corresponding to the p-side contact electrode 40. Subsequently, the second covering layer 44 is removed by dry-etching 75 in the n-side electrode region W5n and the p-side electrode region W5p. The second covering layer 44 can be dry-etched by using a CF-based etching gas. For example, hexafluoroethane ($C_2F_6$) can be used. In this dry-etching step, the n-side protective metal layer 38 and the p-side protective metal layer 42 function as an etching stop layer, preventing a damage to the n-side contact electrode 36 and the p-side contact electrode 40 below. This forms a fourth opening 84 in which the n-side protective metal layer 38 is exposed in the n-side electrode region W5n and a fifth opening 85 in which the p-side protective metal layer 42 is exposed in the p-side electrode region W5p. The fifth mask 65 is then removed.

Figure 12:
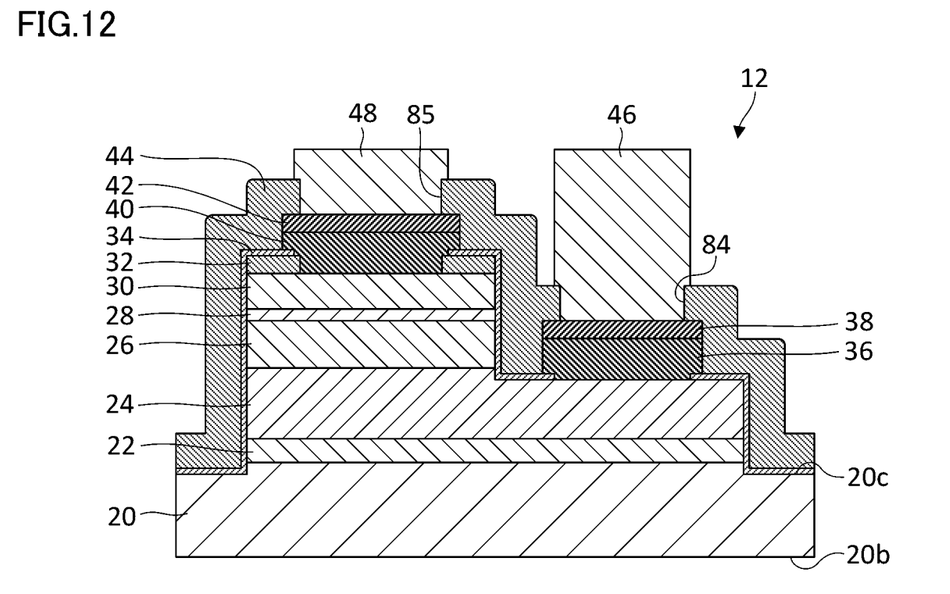
FIG. 12 schematically shows a step of manufacturing the semiconductor light emitting element.

Subsequently, as shown in FIG. 12, the n-side pad electrode 46 is formed on the n-side protective metal layer 38 exposed in the fourth opening 84, and the p-side pad electrode 48 is formed on the p-side protective metal layer 42 exposed in the fifth opening 85. The pad electrodes 46, 48 can be formed by, for example, depositing an Ni layer or a Ti layer and depositing an Au layer thereon. A further, different metal layer may be provided on the Au layer. For example, a stack structure of an Sn layer, an AuSn layer, and an Sn/Au layer may be formed. The die 12 of FIG. 1 is completed through the steps described above.

Figure 13:
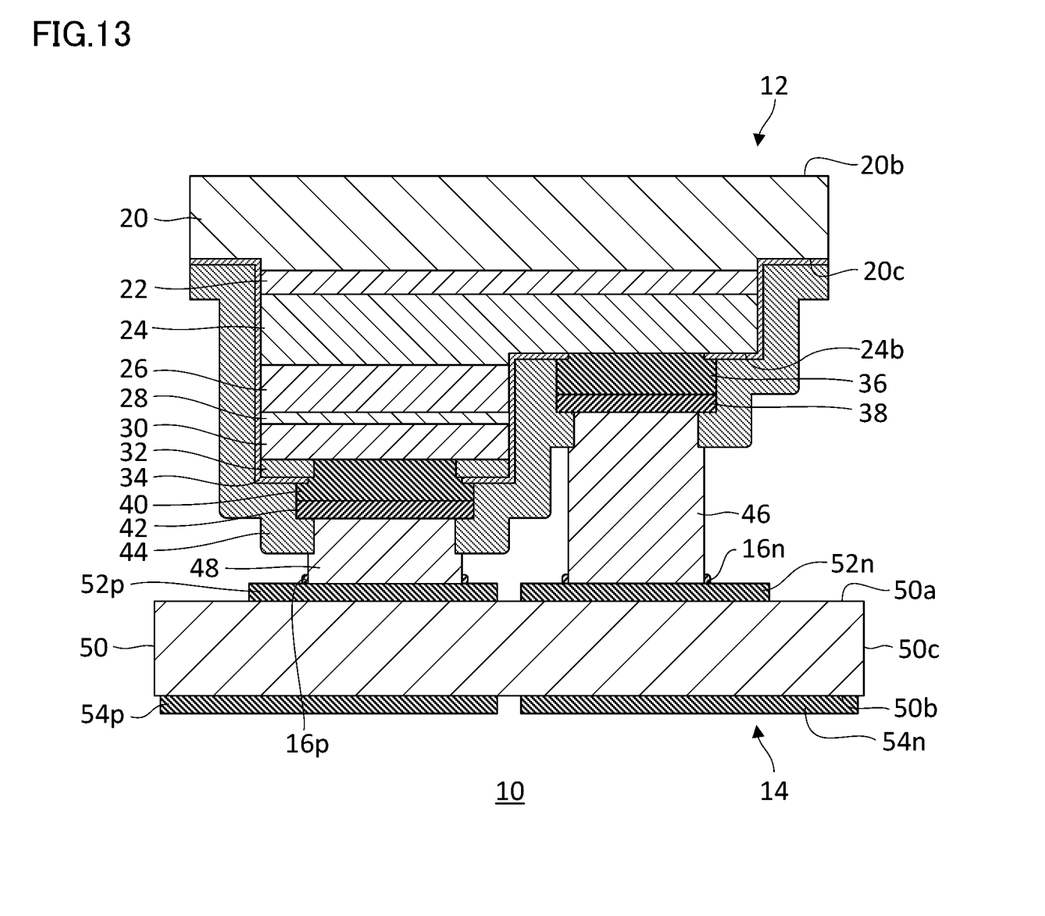
FIG. 13 schematically shows a step of manufacturing the semiconductor light emitting element.

Subsequently, as shown in FIG. 13, the die 12 is mounted on the mounting board 14. First, the die 12 is arranged such that the n-side pad electrode 46 is positioned on the n-side mounting electrode 52n and the p-side pad electrode 48 is positioned on the p-side mounting electrode 52p. Subsequently, the metal bonding members 16n, 16p of gold-tin (AuSn) or solder are melted to bond the pad electrodes 46, 48 to the mounting electrodes 52n, 52p.

Subsequently, the third covering layer 18 is formed to cover the entirety of the surface of the die 12 mounted on the mounting board 14. The third covering layer 18 is made of $Al_2O_3$ and is formed by the ALD method in which TMA and $H_2O$ are used as source materials. This completes the semiconductor light emitting element 10 shown in FIG. 1.

According to this embodiment, by configuring the first covering layer 34, which is directly in contact with semiconductor layers including the n-type clad layer 24, the active layer 26, and the electron blocking layer 28, as an $Al_2O_3$ layer formed by the ALD method, the moisture resistance is enhanced for these semiconductor layers. By not using water ($H_2O$) as a source material of the first covering layer 34, the concentration of hydrogen contained in the first covering layer 34 is lowered. In other words, the hydrogen concentration in the first covering layer 34 is configured to be lower than that of the third covering layer 18. This suitably prevents degradation of the semiconductor layers caused by spreading of the hydrogen contained in the first covering layer 34 to the semiconductor layers.

According to this embodiment, the protective function of the die 12 is enhanced by further providing the second covering layer 44 on the first covering layer 34. Since the first covering layer 34 made of $Al_2O_3$ is formed by the ALD method, it is difficult to provide a large thickness. The thickness of about 50 nm could be the practice upper limit. Meanwhile, the n-side contact electrode 36 and the p-side contact electrode 40 have a thickness of 50 nm or larger and, preferably, 100 nm or larger. Therefore, the first covering layer 34 alone may provide poor performance to cover the contact electrodes. Meanwhile, it is easy to configure the second covering layer 44, which is formed by the CVD method or the like, to have a thickness of 100 nm or larger so that it is possible to cover the contact electrodes having a large thickness suitably. According to this embodiment, the performance of sealing the die 12 is enhanced by combining the first covering layer 34 having a tight structure but having a small thickness with the second covering layer 44 having a large thickness.

According to this embodiment, the die 12 is mounted on the mounting board 14 and then the whole structure is covered by the third covering layer 18 so that the performance of sealing the semiconductor light emitting element 10 is enhanced. In particular, corrosion of the metal materials is suitably prevented by covering the surface of the metal materials of the pad electrodes 46, 48, the mounting electrodes 52n, 52p, and the metal bonding members 16n, 16p. Forming the third covering layer 18 by $Al_2O_3$ also enhances the adhesive contact with the metal material containing gold (Au) and inhibits the reliability from being lowered due to, for example, exfoliation of the third covering layer 18.

According to this embodiment, as the third covering layer 18 is formed by the ALD method using water ($H_2O$) as a source material, it is possible to form the third covering layer 18 covering the entirety of the die 12 and the mounting board 14 in a state that the die 12 and the mounting board 14 are bonded each other. Assuming an $O_2$ plasma or $O_3$ is used as a source material as in the case of the first covering layer 34, activated oxygen would be deactivated before reaching, for example, the gap between the die 12 and the mounting board 14 with the result that portions of the $Al_2O_3$ layer may not be formed properly. In the case of using $H_2O$ as a source material, on the other hand, it is not necessary to place the material in a plasma state. It is therefore possible to cause the source material to reach the gap between the die 12 and the mounting board 14 and to form the $Al_2O_3$ layer more properly. This enhances the reliability of the third covering layer 18.

According to this embodiment, providing the protective insulation layer 32 between the p-type clad layer 30 and the first covering layer 34 reduces a damage impact on the p-type clad layer 30 in the etching step for exposing the p-type clad layer 30. This improves the contact resistance of the p-side contact electrode 40 and improves the output characteristic of the semiconductor light emitting element 10.

Figure 14:
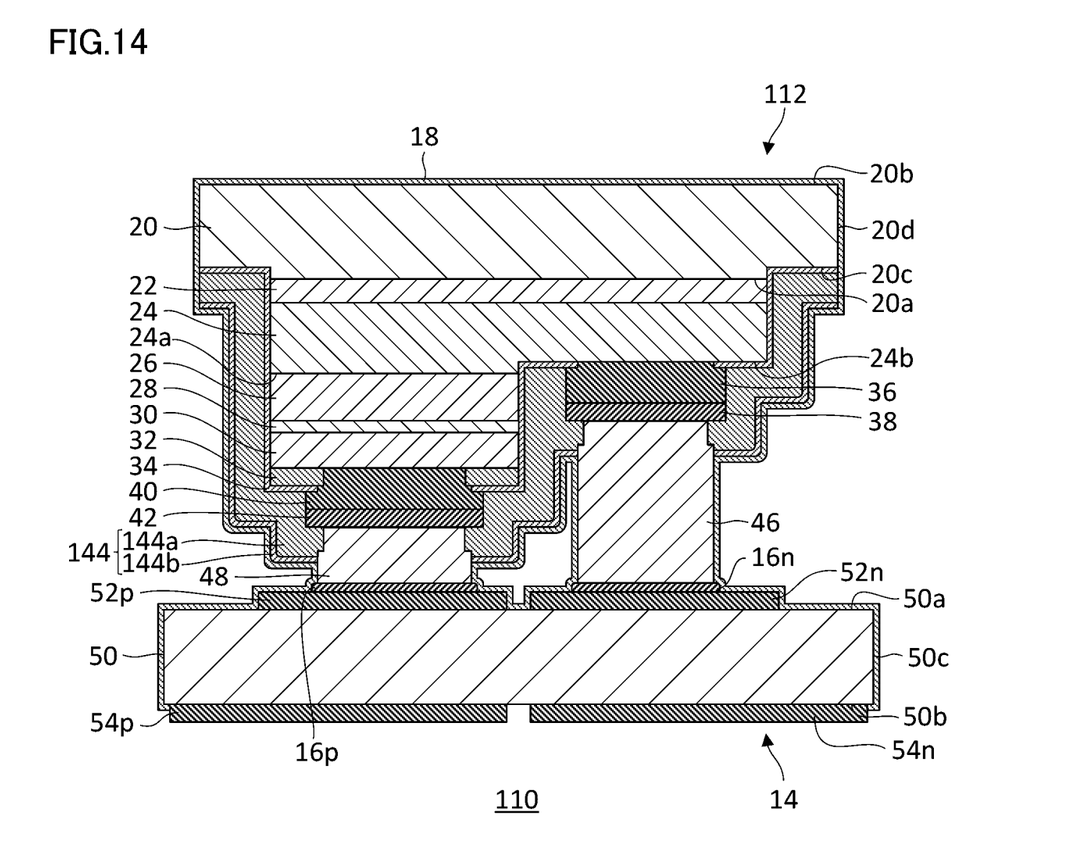
FIG. 14 schematically showing a configuration of a semiconductor light emitting element according to another embodiment.

FIG. 14 is a cross-sectional view schematically showing a configuration of a semiconductor light emitting element 110 according to another embodiment. This embodiment differs from the embodiment described above in that a second covering layer 144 has a double-layer structure of a first layer 144a and a second layer 144b. The following description of this embodiment highlights the difference from the embodiment described above.

The semiconductor light emitting element 110 includes a die 112, a mounting board 14, metal bonding members 16n, 16p, and a third covering layer 18. The mounting board 14, the metal bonding members 16n, 16p, and the third covering layer 18 are configured in a manner similar to that of the embodiment described above.

The die 112 includes a substrate 20, a buffer layer 22, an n-type clad layer 24, an active layer 26, an electron blocking layer 28, a p-type clad layer 30, a protective insulation layer 32, a first covering layer 34, an n-side contact electrode 36, an n-side protective metal layer 38, a p-side contact electrode 40, a p-side protective metal layer 42, a second covering layer 144, an n-side pad electrode 46, and a p-side pad electrode 48. The die 112 is configured in a manner similar to that of the die 12 according to the embodiment described above except that the second covering layer 144 has a double-layer structure.

The second covering layer 144 includes a first layer 144a and a second layer 144b. The first layer 144a is provided to be directly in contact with the first covering layer 34, the n-side contact electrode 36, the n-side protective metal layer 38, the p-side contact electrode 40, and the p-side protective metal layer 42. The second layer 144b is provided to cover the first layer 144a and is provided to be isolated from the first covering layer 34, the n-side contact electrode 36, the n-side protective metal layer 38, the p-side contact electrode 40, and the p-side protective metal layer 42.

For example, the first layer 144a is made of $SiO_2$ and has a lower refractive index than the first covering layer 34 and the second layer 144b. The first layer 144a is configured to have a larger thickness than the first covering layer 34 and the second layer 144b. The thickness of the first layer 144a is 100 nm or larger and is, for example, about 500 nm-10000 nm. The thickness of the first layer 144a is configured to be ten times or more larger than the thickness of the first covering layer 34. The thickness of the first layer 144a may be larger than the thickness of the n-side contact electrode 36 or the p-side contact electrode 40. The thickness of the first layer 144a may be larger than the total thickness of the n-side contact electrode 36 and the n-side protective metal layer 38 or may be larger than the total thickness of the p-side contact electrode 40 and the p-side protective metal layer 42.

The second layer 144b is made of a material different from that of the first layer 144a and is made of a nitride such as AlN and SiN. For example, the second layer 144b is made of SiN and has a higher refractive index than the protective insulation layer 32, the first covering layer 34, and the first layer 144a. The refractive index of $SiO_2$ is 1.49, the refractive index of $Al_2O_3$ is 1.82, the refractive index of SiN is 2.18, and the refractive index of AlN is 2.28 for ultraviolet light having a wavelength of 280 nm. Therefore, the refractive index (2.18 or 2.28) of the second layer 144b made of SiN or AlN is higher than the refractive index (1.49) of the protective insulation layer 32 and the first layer 144a made of $SiO_2$ and is larger than the refractive index (1.82) of the first covering layer 34 made of $Al_2O_3$. The thickness of the second layer 144b is smaller than the thickness of the first layer 144a and is about 50 nm-200 nm. The thickness of the second layer 144b may be smaller than the thickness of the protective insulation layer 32. The thickness of the second layer 144b may be larger than the thickness of the first covering layer 34 or the third covering layer 18.

According to this embodiment, pin holes that could be arisen in the first layer 144a are suitably filled, by stacking, on the first layer 144a, the second layer 144b made of a material different from that of the first layer 144a, thereby enhancing the sealing performance of the second covering layer 144.

According to this embodiment, the relationship $n_1<n_2<n_4$ and the relationship $n_3<n_2<n_4$ hold, where $n_1$ denotes the refractive index of the material of the protective insulation layer 32, $n_2$ denotes the refractive index of the material of the first covering layer 34, $n_3$ denotes the refractive index of the first layer 144a of the second covering layer 144, and $n_4$ denotes the refractive index of the second layer 144b of the second covering layer 144. According to this embodiment, by configuring the refractive index $n_3$ of the first layer 144a to be smaller than the refractive index $n_2$ of the first covering layer 34, the deep ultraviolet light produced in the active layer 26 is totally reflected at the interface between the first covering layer 34 and the first layer 144a and guided toward the second principal surface 20b that is the light extraction surface. This enhances the light extraction efficiency of the semiconductor light emitting element 10. Further, by covering the first layer 144a with the second layer 144b made of a nitride having a higher refractive index than the material of the first layer 144a, the sealing performance and the reliability of the second covering layer 144 are enhanced.

A description will now be given of a method of manufacturing the semiconductor light emitting element 110. Some of the steps of manufacturing the semiconductor light emitting element 110 are common to the steps of manufacturing the semiconductor light emitting element 10 described above, and the steps shown in FIGS. 2-9 are first performed. FIGS. 15-18 schematically show steps of manufacturing the semiconductor light emitting element 110 and show steps that follow the steps of FIG. 9.

Figure 15:
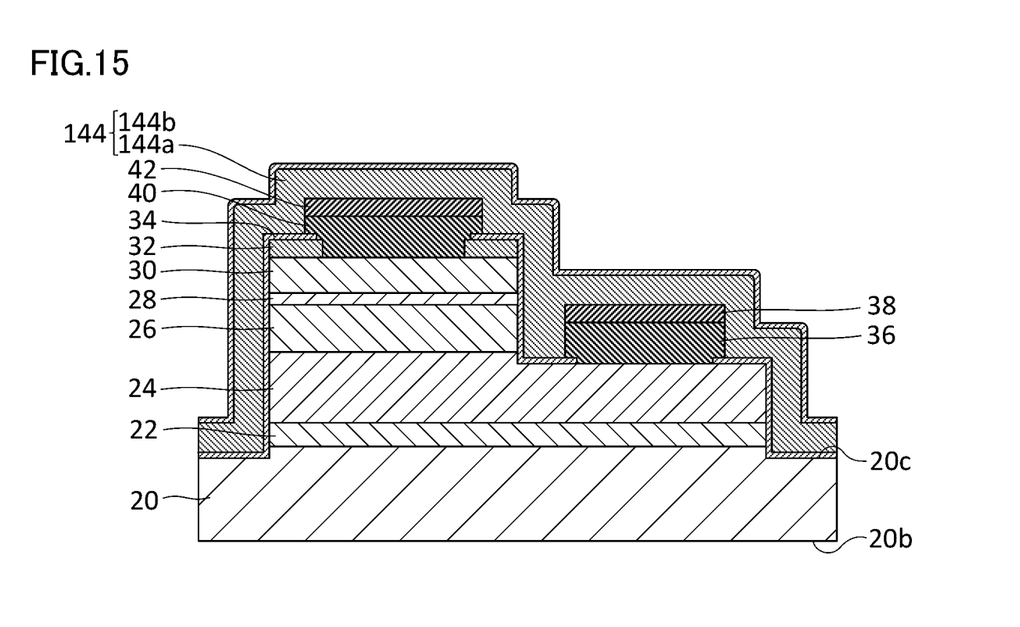
FIG. 15 schematically shows a step of manufacturing the semiconductor light emitting element.

As shown in FIG. 15, the second covering layer 144 is formed to cover the entirety of the top surface of the element structure. The second covering layer 144 includes the first layer 144a and the second layer 144b. The first layer 144a is formed to cover the exposed surface of the first covering layer 34 and to cover the exposed surfaces of the n-side contact electrode 36, the n-side protective metal layer 38, the p-side contact electrode 40, and the p-side protective metal layer 42. The second layer 144b is formed to cover the exposed surface of the first layer 144a. The first layer 144a is, for example, an $SiO_2$ layer and can be formed by a well-known technology such as plasma CVD. The second layer 144b is, for example, an SiN layer and can be formed by a well-known technology such as plasma CVD.

Figure 16:
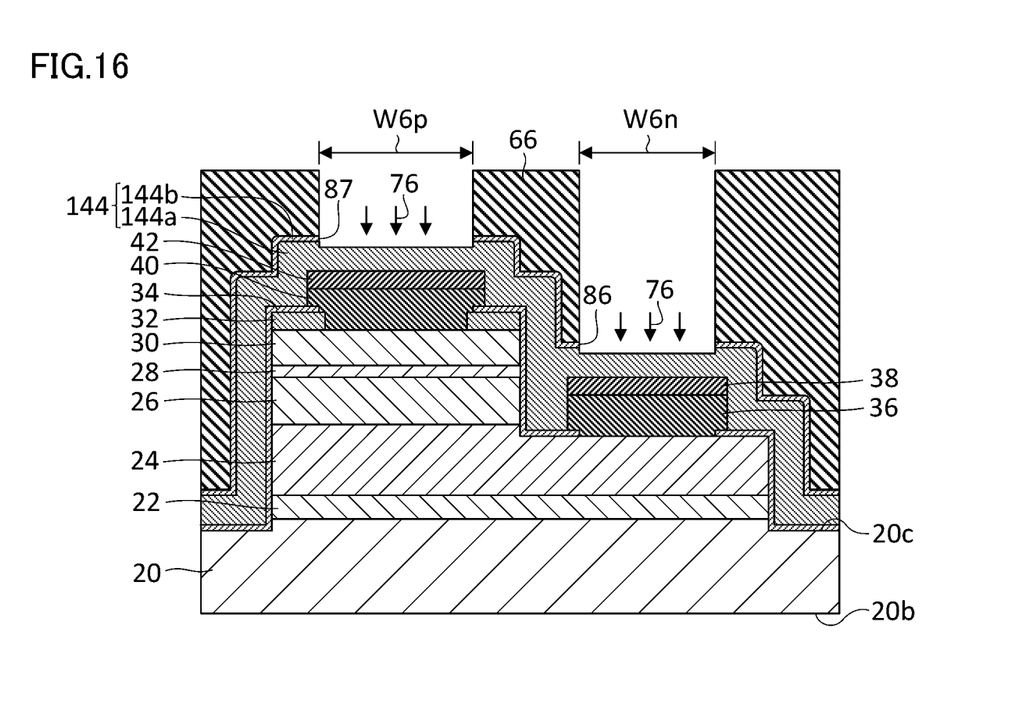
FIG. 16 schematically shows a step of manufacturing the semiconductor light emitting element.

Subsequently, as shown in FIG. 16, a sixth mask 66 is formed on the second covering layer 144. The sixth mask 66 is formed to exclude an n-side electrode region W6n corresponding to the n-side contact electrode 36 and a p-side electrode region W6p corresponding to the p-side contact electrode 40. Subsequently, the second layer 144b of the second covering layer 144 is removed by dry-etching 76 in the n-side electrode region W6n and the p-side electrode region W6p. The second covering layer 144 can be dry-etched by using a CF-based etching gas. For example, hexafluoroethane ($C_2F_6$) can be used. The dry-etching step is performed until the second layer 144b is removed in the n-side electrode region W6n and the p-side electrode region W6p to expose the first layer 144a. This forms a sixth opening 86 in the n-side electrode region W6n in which the first layer 144a is exposed and forms a seventh opening 87 in the p-side electrode region W6p in which the p-side protective metal layer 42 is exposed. As shown in FIG. 16, the exposed portion of the first layer 144a may be further removed to a certain depth in this dry-etching step. In other words, a step may be formed on the top surface of the first layer 144a. The sixth mask 66 is then removed.

Figure 17:
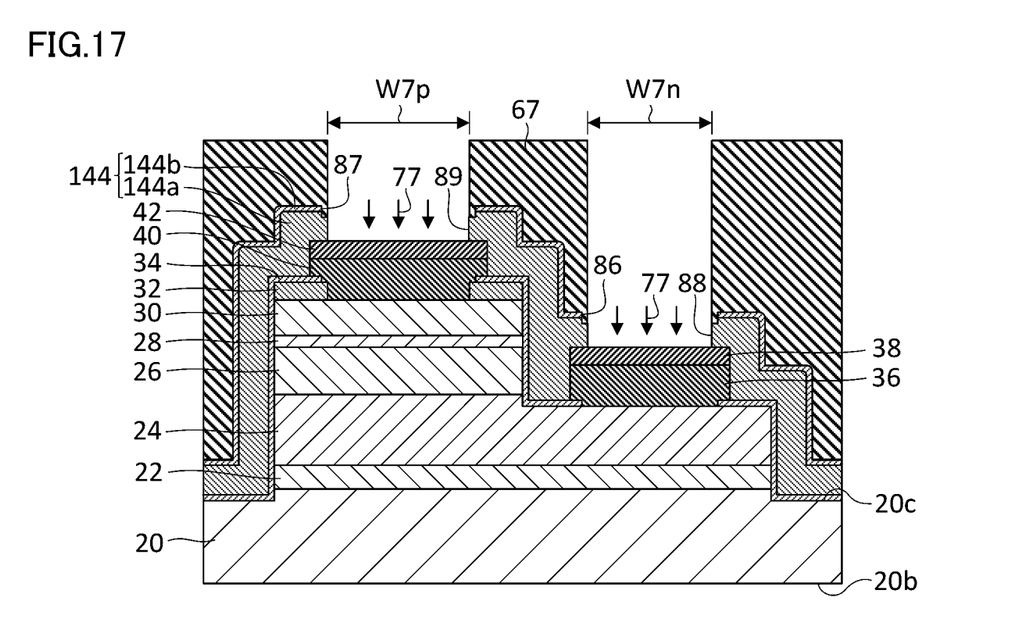
FIG. 17 schematically shows a step of manufacturing the semiconductor light emitting element.

Subsequently, as shown in FIG. 17, a seventh mask 67 is formed on the second covering layer 144. The seventh mask 67 is formed to exclude an n-side electrode region W7n corresponding to the n-side contact electrode 36 and a p-side electrode region W7p corresponding to the p-side contact electrode 40. The seventh mask 67 is provided to cover the second layer 144b completely and is provided to cover the side walls of the second layer 144b in the sixth opening 86 and in the seventh opening 87. Accordingly, the diameter of the opening in the seventh mask 67 in the n-side electrode region W7n is smaller than the diameter of the opening in the sixth mask 66 in the n-side electrode region W6n. Similarly, the diameter of the opening in the seventh mask 67 in the p-side electrode region W7p is smaller than the diameter of the opening in the sixth mask 66 in the p-side electrode region W6p. Subsequently, the first layer 144a of the second covering layer 144 is removed by dry-etching 77 in the n-side electrode region W7n and the p-side electrode region W7p. The second covering layer 144 can be dry-etched by using a CF-based etching gas. For example, hexafluoroethane ($C_2F_6$) can be used. The dry-etching step is performed until the first layer 144a is removed in the n-side electrode region W7n and the p-side electrode region W7p to expose the n-side protective metal layer 38 and the p-side protective metal layer 42. In this dry-etching step, the n-side protective metal layer 38 and the p-side protective metal layer 42 function as an etching stop layer, preventing a damage to the n-side contact electrode 36 and the p-side contact electrode 40 below. This forms an eighth opening 88 in the n-side electrode region W7n in which the n-side protective metal layer 38 is exposed and forms a ninth opening 89 in the p-side electrode region W7p in which the p-side protective metal layer 42 is exposed. The seventh mask 67 is then removed.

Figure 18:
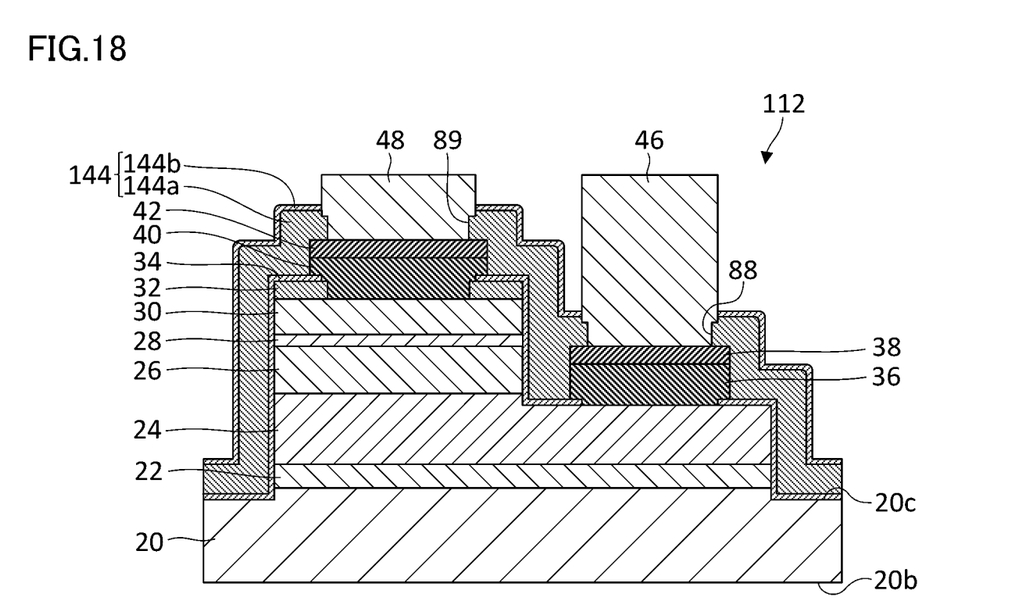
FIG. 18 schematically shows a step of manufacturing the semiconductor light emitting element.

Subsequently, as shown in FIG. 18, the n-side pad electrode 46 is formed on the n-side protective metal layer 38 exposed in the eighth opening 88, and the p-side pad electrode 48 is formed on the p-side protective metal layer 42 exposed in the ninth opening 89. The pad electrodes 46, 48 can be formed by, for example, depositing an Ni layer on a Ti layer and depositing an Au layer thereon. A further metal layer may be provided on the Au layer. For example, a stack structure of an Sn layer, an AuSn layer, and an Sn/Au layer may be formed. The die 112 shown FIG. 14 is completed through the steps described above.

Subsequently, as similar to that shown in FIG. 13, the die 112 is mounted on the mounting board 14, and the third covering layer 18 is formed to cover the entirety of the surface of the die 112 mounted on the mounting board 14. The third covering layer 18 is made of $Al_2O_3$ and is formed by, for example, the ALD method in which TMA and $H_2O$ are used as source materials. This completes the semiconductor light emitting element 110 shown in FIG. 14.

Described above is an explanation based on an exemplary embodiment. The embodiment is intended to be illustrative only and it will be understood by those skilled in the art that various design changes are possible and various modifications are possible and that such modifications are also within the scope of the present invention.

When the $Al_2O_3$ layer is formed by the ALD method in the embodiments described above, the first step of introducing TMA and the second step of introducing an $O_2$ plasma, $O_3$, or $H_2O$ are alternately repeated. It may be ensured that the surface that should be covered by the $Al_2O_3$ layer is first covered by TMA, by performing the first step at the beginning. In other words, the surface to be covered by the $Al_2O_3$ layer may be prevented from being damaged by an $O_2$ plasma gas-induced oxidation or etching of the surface due to performing the second step at the beginning. In particular, the side of the active layer 26 can be prevented from being damaged by introducing TMA first when the first covering layer 34 for covering the side of the active layer 26 is formed. This enhances the reliability of the semiconductor light emitting elements 10, 110.

In the embodiments described above, an n-side protective layer made of conductive titanium nitride (TiN) may be used in place of the n-side protective metal layer 38. Similarly, a p-side protective layer made of titanium nitride (TiN) may be used in place of the p-side protective metal layer 42. The use of the n-side protective layer and the p-side protective layer made of TiN also cause the TiN layer to function as a stop layer in the dry-etching step. Further, the use of TiN enhances the intimacy of contact to the second covering layer 44 or the second covering layer 144 and suitably prevents exfoliation of the second covering layer 44 or the second covering layer 144 from the contact electrodes 36, 38.

In the embodiments described above, the semiconductor light emitting elements 10, 110 in which the dies 12, 112 are mounted on the mounting board 14 are shown. In an alternative embodiment, the dies 12, 112 that are not mounted on the mounting board 14 may be used as semiconductor light emitting elements. In this case, the third covering layer 18 may be provided on surfaces of the dies 12, 112, or the third covering layer 18 may not be provided.

It should be understood that the invention is not limited to the above-described embodiment but may be modified into various forms on the basis of the spirit of the invention. Additionally, the modifications are included in the scope of the invention.

What is claimed is:

1. A semiconductor light emitting element comprising:
    an n-type semiconductor layer of an n-type aluminum gallium nitride (AlGaN)-based semiconductor material provided on a substrate;
    an active layer of an AlGaN-based semiconductor material provided in a first region on the n-type semiconductor layer;
    a p-type semiconductor layer of a p-type AlGaN-based semiconductor material provided on the active layer;
    a first covering layer that is provided to cover a second region on the n-type semiconductor layer different from the first region, a side of the active layer, and the p-type semiconductor layer, wherein the first covering layer is made of aluminum oxide ($Al_2O_3$);
    an n-side contact electrode that extends through the first covering layer and is in contact with the n-type semiconductor layer;
    a p-side contact electrode that extends through the first covering layer and is in contact with the p-type semiconductor layer;
    a second covering layer provided to cover the first covering layer, the n-side contact electrode, and the p-side contact electrode;
    an n-side pad electrode that extends through the second covering layer and is connected to the n-side contact electrode;
    a p-side pad electrode that extends through the second covering layer and is connected to the p-side contact electrode; and a third covering layer provided to cover at least a part of each of a surface of the substrate, the second covering layer, a side of the n-side pad electrode, and a side of the p-side pad electrode, wherein the third covering layer is made of aluminum oxide ($Al_2O_3$).

2. The semiconductor light emitting element according to claim 1, further comprising:
a mounting board that includes an n-side mounting electrode connected to the n-side pad electrode and a p-side mounting electrode connected to the p-side pad electrode, wherein
the third covering layer is provided to further cover at least a part of a surface of the mounting board.

3. The semiconductor light emitting element according to claim 1, wherein
a concentration of hydrogen contained in the first covering layer is lower than a concentration of hydrogen contained in the third covering layer.

4. The semiconductor light emitting element according to claim 1, further comprising:
a protective insulation layer provided between the p-type semiconductor layer and the first covering layer, wherein the protective insulation layer is made of silicon oxide ($SiO_2$) or silicon oxynitride (SiON).

5. The semiconductor light emitting element according to claim 1, wherein
the second covering layer includes an $SiO_2$ layer having a thickness ten times or more larger than a thickness of the first covering layer.

6. The semiconductor light emitting element according to claim 5, wherein the second covering layer may further include a nitride layer that covers the $SiO_2$ layer.

7. The semiconductor light emitting element according to claim 1, wherein
the second covering layer includes a first layer made of a material having a lower refractive index than a material of the first covering layer and a second layer that is made of a higher refractive index than the material of the first covering layer, wherein the second layer covers the first layer.

8. The semiconductor light emitting element according to claim 1, wherein
the n-type semiconductor layer has a molar fraction of aluminum nitride (AlN) of 20% or higher, and
the active layer is configured to emit ultraviolet light having a wavelength of 350 nm or shorter.

9. A method of manufacturing a semiconductor light emitting element, comprising:
stacking, on a substrate, an n-type semiconductor layer of an n-type aluminum gallium nitride (AlGaN)-based semiconductor material, an active layer of an AlGaN-based semiconductor material on the n-type semiconductor layer, and a p-type semiconductor layer of a p-type AlGaN-based semiconductor material on the active layer successively;
removing a portion of each of the p-type semiconductor layer, the active layer, and the n-type semiconductor layer to expose a portion of the n-type semiconductor layer;
forming a first covering layer made of aluminum oxide ($Al_2O_3$) to cover an exposed region of the n-type semiconductor layer, a side of the active layer, and the p-type semiconductor layer;
removing the first covering layer in part to form an n-side contact electrode that is in contact with the n-type semiconductor layer;
removing the first covering layer in part to form a p-side contact electrode that is in contact with the p-type semiconductor layer;
forming a second covering layer that covers the first covering layer, the n-side contact electrode, and the p-side contact electrode;
removing the second covering layer in part to form an n-side pad electrode that is connected to the n-side contact electrode;
removing the second covering layer in part to form a p-side pad electrode that is connected to the p-side contact electrode; and
forming a third covering layer made of aluminum oxide ($Al_2O_3$) to cover at least a part of each of a surface of the substrate, the second covering layer, a side of the n-side pad electrode, and a side of the p-side pad electrode.

10. The method of manufacturing a semiconductor light emitting element according to claim 9, wherein
the first covering layer is formed by an atomic layer deposition method in which an organic aluminum compound and an oxygen gas ($O_2$) plasma or an ozone gas ($O_3$) are used as source materials, and
the third covering layer is formed by an atomic deposition method in which an organic aluminum compound and water ($H_2O$) are used as source materials.

* * * * *